(12) United States Patent
Mittereder et al.

(10) Patent No.: US 7,338,826 B2
(45) Date of Patent: Mar. 4, 2008

(54) SILICON NITRIDE PASSIVATION WITH AMMONIA PLASMA PRETREATMENT FOR IMPROVING RELIABILITY OF ALGAN/GAN HEMTS

(75) Inventors: Jeffrey A. Mittereder, Annandale, VA (US); Andrew P. Edwards, Cary, NC (US); Steven C. Binari, Annandale, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/311,592

(22) Filed: Dec. 9, 2005

(65) Prior Publication Data

US 2007/0131970 A1 Jun. 14, 2007

(51) Int. Cl.
*H01L 21/00* (2006.01)
*H01L 21/338* (2006.01)
*H01L 21/469* (2006.01)
*H01L 21/31* (2006.01)

(52) U.S. Cl. .............. 438/38; 438/47; 438/94; 438/167; 438/172; 438/191; 438/762; 438/791; 257/192; 257/194; 257/E21.454

(58) Field of Classification Search .......... 438/38, 438/47, 94, 167, 172, 186, 191, 169, 762, 438/606, 709, 791; 257/192, 194, E21.454
See application file for complete search history.

(56) References Cited

U.S. PATENT DOCUMENTS

| 5,179,029 | A | | 1/1993 | Gottscho et al. | |
|---|---|---|---|---|---|
| 5,464,664 | A | * | 11/1995 | Aydil et al. | 438/718 |
| 5,913,149 | A | * | 6/1999 | Thakur et al. | 438/762 |
| 6,737,683 | B2 | * | 5/2004 | Inoue et al. | 257/192 |
| 7,122,451 | B2 | * | 10/2006 | Inoue et al. | 438/513 |
| 2002/0142622 | A1 | * | 10/2002 | Iijima et al. | 438/768 |
| 2003/0017692 | A1 | * | 1/2003 | Noguchi et al. | 438/622 |
| 2003/0020092 | A1 | * | 1/2003 | Parikh et al. | 257/192 |

(Continued)

OTHER PUBLICATIONS

Liu, et al., "Bias Stress Measurements on High Performance AlGaN/GaN HFET Devices," Physica Status Solidi, vol. 188, No. 1, pp. 233-237 (2001).

(Continued)

*Primary Examiner*—Michael Lebentritt
*Assistant Examiner*—Mohsen Ahmadi
(74) *Attorney, Agent, or Firm*—John J. Karasek; Rae Lynn P. Guest; Aisha Ahmad

(57) ABSTRACT

This invention pertains to an electronic device and to a method for making it. The device is a heterojunction transistor, particularly a high electron mobility transistor, characterized by presence of a 2 DEG channel. Transistors of this invention contain an AlGaN barrier and a GaN buffer, with the channel disposed, when present, at the interface of the barrier and the buffer. Surface treated with ammonia plasma resembles untreated surface. The method pertains to treatment of the device with ammonia plasma prior to passivation to extend reliability of the device beyond a period of time on the order of 300 hours of operation, the device typically being a 2 DEG AlGaN/GaN high electron mobility transistor with essentially no gate lag and with essentially no rf power output degradation.

12 Claims, 3 Drawing Sheets

U.S. PATENT DOCUMENTS

| | | | |
|---|---|---|---|
| 2003/0157815 A1 | 8/2003 | Weimer et al. | |
| 2004/0232440 A1* | 11/2004 | Ohtsuka et al. | 257/183 |
| 2005/0258451 A1* | 11/2005 | Saxler et al. | 257/192 |
| 2006/0076577 A1 | 4/2006 | Boos et al. | |
| 2006/0108606 A1* | 5/2006 | Saxler et al. | 257/200 |
| 2006/0226412 A1* | 10/2006 | Saxler et al. | 257/11 |

OTHER PUBLICATIONS

Kim, et al., "Degradation Characteristics of AlGaN/GaN High Electron Mobility Transistors," IEEE Proceedings from 39th Annual International Reliability Physics Symposium Orlando, Flroida, pp. 214-218 (Apr. 30-May 3, 2001).

Borges, Ric, "Gallium nitride electronic devices for high-power wireless applications," RF Semiconductors, pp. 72-82 (Aug. 2001).

Nuttinck et al., "Development of GaN Wide Bandgap Technology for Microwave Power Applications," IEEE Microwave Magazine, pp. 80-87 (Mar. 2002).

Eastman, et al., "The Toughest Transistor Yet," IEEE Spectrum, pp. 28-33 (May 2002).

Lee, et al., "Reliability evaluation of AlGaN/GaN HEMTs grown on SiC substrate," IEEE Proceedings Lester Eastman Conference, pp. 436-442 (Aug. 6-8, 2002).

Mittereder, et al., "Current collapse induced in GaN HEMTs by bias stress," Applied Physics Letters, vol. 83, No. 8, pp. 1650-1652 (2003).

Klein, et al., "Traps in GaN-based Microwave Devices," 2002 Naval Research Laboratory Annual Review (2003), as printed from Naval Research Laboratory Website <http://www.nrl.navy.mil/content.php?P=02REVIEW122> on Apr. 4, 2007.

Sahoo, et al., "High-field effects in silicon nitride passivated GaN MODFETs," IEEE Transactions on Electron Devices, vol. 50, No. 5, pp. 1163-1170 (May 2003).

Kim, et al., "Effects of SiN passivation on high-electric field on AlGaN-GaN HFET degradation," IEEE Electronic Device Letters, vol. 24, No. 7, pp. 421-423 (Jul. 2003).

Klein, et al., "Photoionisation spectroscopy of traps in AlGaN/GaN high electron mobility transistors grown by molecular beam epitaxy," Electronics Letters, vol. 39, No. 18, pp. 1354-1356 (Sep. 4, 2003).

Mizutani, et al., "A study on current collapse in AlGaN/GaN HEMTs induced by bias stress," IEEE Transactions on Electron Devices, vol. 50, No. 10, pp. 2015-2020 (Oct. 2003).

Valizadeh, et al., "Low frequency noise-based monitoring of the effects of RF and DC stress on AlGaN/GaN MODFETs," IEEE 25th Annual Technical Digest of Gallium Arsenide Integrated Circuit Symposium, pp. 78-81 (Nov. 9-12, 2003).

Polyakov, et al., "Electrical and Optical Properties of Hydrogen Plasma Treated n-AlGaN Films Grown by Hydride Vapor Phase Epitaxy," J. Vac. Sci. Technol. B, vol. 22, No. 1, pp. 77-81 (Jan./Feb. 2004).

Edwards, et al. "Improved Reliability of AlGaN-GaN HEMTs Using an NH3 Plasma Treatment Prior to SiN Passivation," IEEE Electron Device Letters, vol. 26, No. 4, pp. 225-227 (Apr. 2005).

Trion Technical Papers, "Cookbook-Plasma Basics" (Date Unknown).

* cited by examiner (a)

(b)

SILICON NITRIDE PASSIVATION WITH AMMONIA PLASMA PRETREATMENT FOR IMPROVING RELIABILITY OF ALGAN/GAN HEMTS

BACKGROUND OF THE INVENTION

1. Field of the Invention

This invention pertains to improving reliability of heterojunction transistors, particularly high electron mobility transistors, with an ammonia plasma pretreatment prior to passivation.

2. Description of Related Art

Prior methods which have been used to prepare processed AlGaN/GaN high electron mobility transistors(HEMTs) for reliable operation in the past have included using no passivation at all, or direct deposition of a variety of electrically insulating materials intended to passivate surface states. These material films can be deposited by such processes as plasma enhanced chemical vapor deposition. Silicon nitride (SiN) is one of the most commonly used surface passivating films for AlGaN/GaN HEMTs and can be deposited onto the device by the aforementioned method. However, silicon nitride passivation, while an improvement over no passivation at all, still results in a decrease in performance of the device after dc and rf bias stress. This is a significant limitation and disadvantage in the reliability of AlGaN/GaN HEMT electronic devices.

AlGaN/GaN high electron mobility transistors have shown exceptional microwave power output densities, with a recently reported continuous wave power density of 30 W/mm and 50% power added efficiency at a frequency of 8 GHz, In addition, a 36-mm gate-width GaN HEMT has been demonstrated with a total power output of 150 W and a power added efficiency of 54%. However, device reliability remains a major concern for III-N HEMTs. In AlGaN/GaN HEMTs, degradation of the dc, transient, and microwave characteristics are often seen after relatively short periods of normal device operation. Although reliability is improving, microwave power output typically degrades by more than 1 dB in less than 1000 hours of operation.

OBJECTS AND BRIEF SUMMARY OF THE INVENTION

It is an object of this invention to pretreat an AlGaN/GaN heterojunction field effect transistor with ammonia plasma prior to passivation in order to improve reliability thereof.

Another object of this invention is to pretreat an AlGaN/GaN transistor with a low-power ammonia plasma prior to silicon nitride deposition for high power applications.

Another object of this invention is to improve reliability of an AlGaN/Gan transistor adapted for use in radars and communication equipment.

Another object of this invention is to improve reliability of AlGaN/GaN HEMTS characterized by the presence of 2 DEG channel.

Another object of this invention is prevention of drain current collapse caused by electron traps.

Another object of this invention relates to reduction of surface and bulk traps in high power and high electron mobility AlGaN/GaN heterojunction transistors that can potentially operate at voltages exceeding 100 volts and with electron mobility in excess of 1000 $cm^2/v$ sec.

These and other objects of this invention can be attained by pretreatment of a 2 DEG AlGaN/GaN heterojunction transistor with a low-power ammonia plasma prior to passivation.

DETAILED DESCRIPTION OF THE INVENTION

Figure 1:
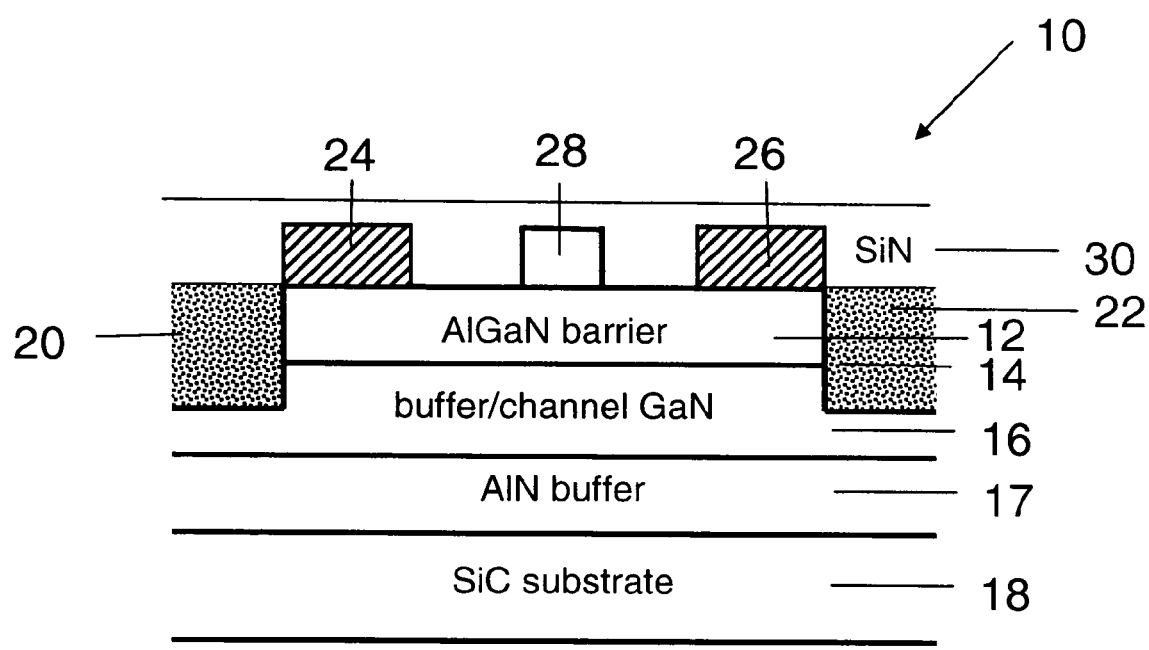
FIG. 1 is a cross-sectional schematic representation of a high mobility transistor with AlGaN, GaN and doped GaN layers deposited on a silicon carbide substrate.
Figure 2:
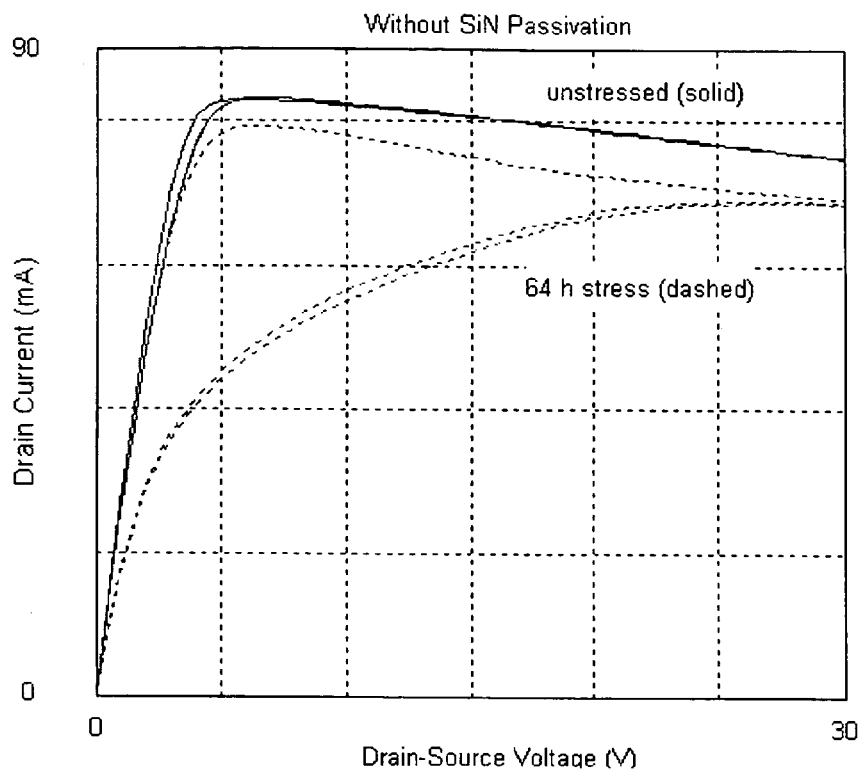
FIGS. 2(a) and (b) show induced current collapse of unpassivated HEMT in (a) before stress and after stress and in (b) of passivated HEMT devices with silicon nitride only and with silicon nitride passivation, stressed for 60 hours and 176 hours, respectively.
Figure 2:
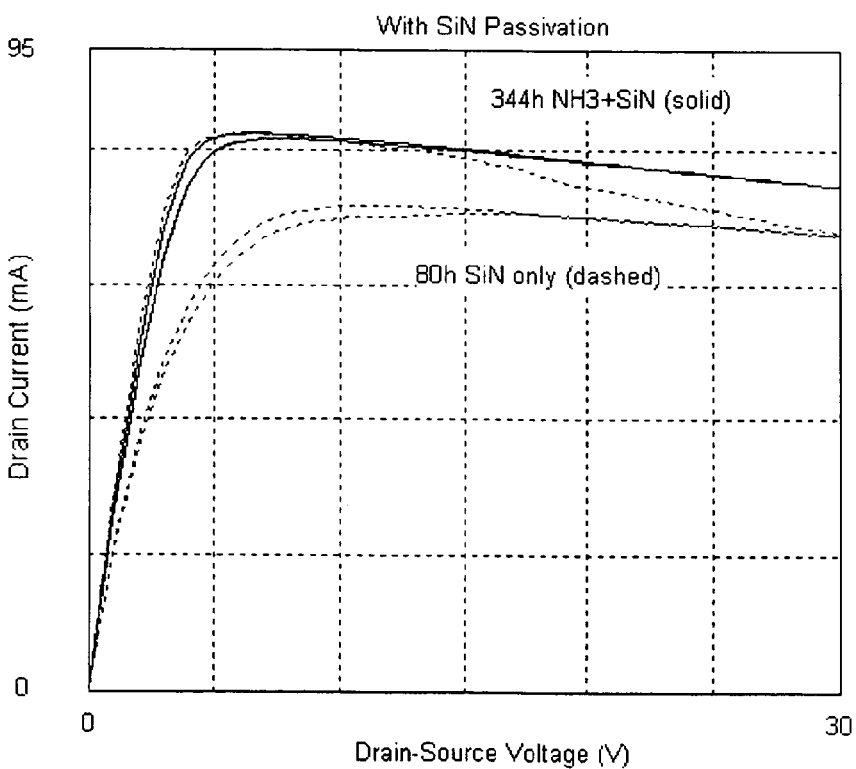

The purpose of this invention, in a preferred embodiment, is to improve the reliability of of aluminum gallium nitride/gallium nitride (AlGaN/GaN) high electron mobility transistors by incorporating an ammonia ($NH_3$) plasma pretreatment prior to silicon nitride (SiN) passivation of the heterojunction transistors after all other processing has been completed.

This invention pertains to an electronic device and to a method for making it. The device is a heterojunction transistor, particularly a high electron mobility transistor characterized by the presence of a 2 DEG channel. Transistors of this invention contain an AlGaN barrier and a GaN buffer, with the channel disposed, when present, at the interface of the barrier and the buffer. The method pertains to treatment of the device with ammonia plasma prior to passivation to extend reliability of the device beyond a period of time on the order of 300 hours of operation, the device typically being a 2 DEG AlGaN/GaN high electron mobility transistor with essentially no gate lag and with essentially no rf power output degradation.

Pursuant to one embodiment of the method, an in-situ ammonia plasma treatment is used before a silicon nitride deposition on an $Al_x Ga_{1-x}N$/GaN (where x is 0.20 to 0.30), after all other processing has been completed. The ammonia plasma pretreatment and the silicon nitride deposition can both be performed in a plasma enhanced chemical vapor deposition system. The substrate temperature is maintained at 250° C. for both. For the ammonia plasma pretreatment, a relatively low 35 W power level is typically used. An example of resulting process parameters are 200 mT chamber pressure, 400 sccm $N_2$+$SiH_4$ (95:5) gas flow, 9 sccm ammonia gas flow, 35 W ICP power, and 0W RWE power. A silicon nitride film thickness of 750 A is adequate, with an optical index (n) of approximately 2.0, which indicates the approximate composition of the $Si_3N_4$ passivation layer.

The nitride deposition process was performed after all of the processing steps and was followed by etching openings to the metal contacts and deposition and patterning of a Ti—Au overlay metal. The ammonia plasma pretreatment and the silicon nitride deposition were performed in an inductively coupled plasma (ICP) configured plasma-enhanced chemical vapor deposition system with a bottom electrode diameter of 8 inches. The silicon nitride film, using about 5% by volume $SiH_4$ in a balance of $N_2$, was formed using a $SiH_4$:$NH_3$:$N_2$ plasma recipe ($N_2$+$SiH_4$ of 300 to 400 sccm; $NH_3$ of 9 to 16 sccm). The substrate temperature was maintained at 250° C. for both the ammonia plasma pretreatment and the silicon nitride deposition processes. The silicon nitride film thickness and the refractive index were measured by ellipsometry, and were 740-800 A and 2.03-2.09, respectively, for different device runs. For the pretreatment, the chamber pressure was 50 mT and the duration was 180 seconds. The ICP power was set to 35 W at 13.56 MHz, while the bottom electrode was set to 0 W.

The invention can be described in connection with FIGS. 1-4 wherein FIG. 1 shows a cross-sectional schematic transistor 10 containing barrier layer 12 disposed on channel 14, which is followed by channel/buffer layer 16, which in turn is disposed on buffer layer 17, and which in turn is disposed on substrate 18. The substrate supports all of the layers of the transistor. The barrier layer is AlGaN and the buffer/channel layer is GaN with the channel layer being at the interface of the barrier and the buffer/channel layers. The channel has a thickness on the order of 50 A to 100 A. It is the 2 DEG channel layer that characterizes a high electron mobility transistor, with electron mobility being in excess of 1000 $cm^2$/V sec. There is a layer of AlN between the buffer/layer and the substrate layers. The 2-DEG is formed at the interface of the buffer/channel and the barrier layers.

Completing the schematic transistor of FIG. 1 is contact 20 which provides electrical connection to source 24, barrier layer 12, and buffer /channel layer 16. Likewise, contact 22 provides electrical connection to drain 26, barrier layer 12, and buffer/channel layer 16. Source 24, drain 26, and gate 28 are disposed in top layer 30. Purpose of the source is to provide electrons to the transistor device. These electrons flow through the interface 2 DEG between the barrier layer and the buffer/channel layer to the drain. The gate controls the flow of these electrons through the 2 DEG. The source, the drain and the ohmic contacts 20, 22, 24 and 26 are typically Ti—Al—Ni—Au and the gate is typically Ni—Au. Typical barrier layer thickness is 200 A 300 A, typical channel layer thickness is 50 A to 100 A, typical buffer/channel layer thickness is 1 μm to 3 μm, typical buffer layer thickness is 500 A to 1500 A and typical substrate thickness is 1 μm to 2 μm.

Shown in FIGS. 2(a) and (b) are the measured drain current for three consecutive sweeps of $V_{DS}$ from 0 to 30V with $V_{GS}$ held at 0 V. The characteristics in FIG. 2(a) are for an AlGaN/GaN HEMT without silicon nitride passivation prior to dc bias stress. For the non-stressed device (solid lines), the three traces are nearly coincident, as they should be. But after dc bias stress for 64 hours with $V_{DS}$=30V and $I_{DS}$=200 mA/mm (dashed lines), the second and third traces depart significantly from the first trace. This reduction in drain current for the second and third traces is due to trapped charge in the structure as a result of hot electron injection caused at high drain voltages during the first sweep. This effect is present in the device after stress due to the generation or activation of defects during the 64 hour dc bias stress. It can be see in FIG. 2(b), that a silicon nitride passivation layer does little to suppress this effect (dashed lines). But the key result, shown in the solid lines, is that an ammonia plasma treatment prior to passivation completely eliminates this effect for at least 176 hours of bias stress.

Figure 3:
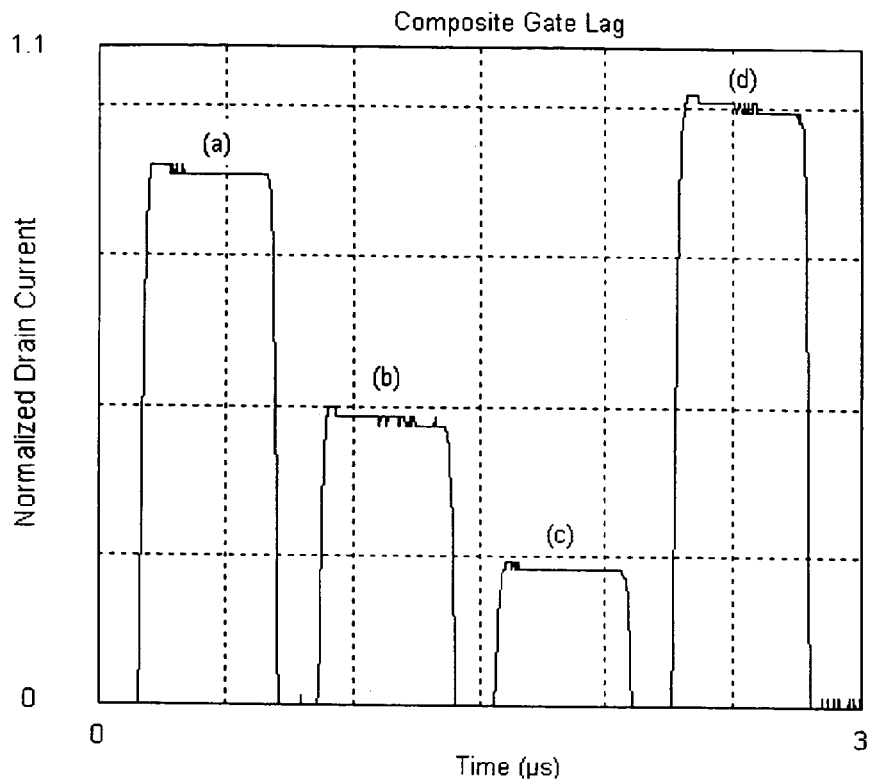
FIG. 3 is a plot of normalized Drain Current versus Time, showing drain current response to pulsed gate voltage, in (a) with no passivation; in (b) for the same device after 64-hour stress; in (c) silicon nitride passivated device after 80-hour stress; and in (d) a device pretreated with ammonia plasma and passivated with silicon nitride, after 176-hour stress.

Corresponding results are seen with gate lag measurements as shown in FIGS. 3(a-d). The gate lag measurements are for $V_{DS}$=1 V and $V_{GS}$=$V_{TH}$-2 V, pulsed to $V_{GS}$=0 V. The drain current pulse shown in each figure is normalized to the steady state value of drain current. The ideal response characteristic is for the pulsed current to rise to the steady state value, as shown in FIG. 2(d). Only the ammonia plasma plus silicon nitride processed device shows the ideal characteristic after bias stress. These characteristics again indicate that additional trapping levels are present after dc bias stress and that the ammonia plasma step is effective in suppressing their generation.

Figure 4:
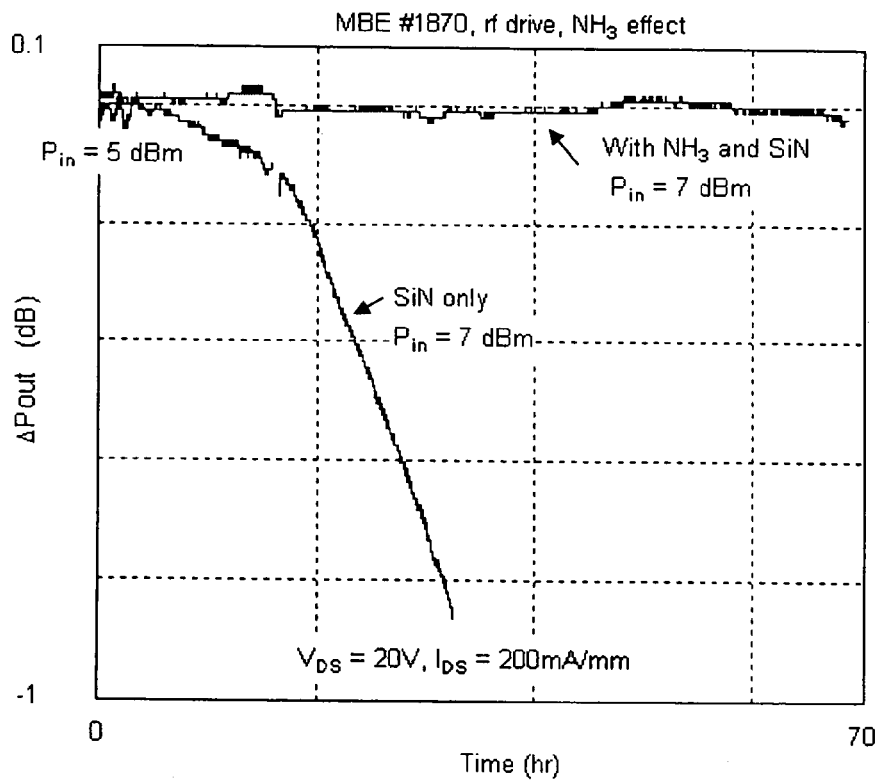
FIG. 4 is a plot of power $P_{out}$ versus Time showing rf output degradation of (a) passivated device with silicon nitride only and (b) pre-treated with ammonia plasma and coated or pre-treated with silicon nitride wherein stress conditions were 20v, 200 mA/mm operated at 2 GHz at 1 dB compression of the gain.

The radio frequency (rf) degradation rate, in dB/hour, is also improved by more than 100 times for the ammonia pretreated sample as compared to devices on the same split wafer with silicon nitride only. FIG. 4 shows the change in Pout, normalized to its initial value, versus hours of rf bias stress. The pre-treated device shows little drop to 70 hours with a Pin of 7 dBm, while the silicon nitride only device is degrading in the first 16 hours at Pin of 5 dBm, then even more rapidly after Pin was increased to 7 dBm.

An added benefit of the invention is believed to be that the ammonia plasma provides hydrogen (H) atoms at the AlGaN surface. Passivation of surface defects by hydrogen has been used extensively in the past for silicon and gallium arsenide technologies. Hydrogen has been found to penetrate well into the AlGaN and reduce the density of bulk n-AlGaN deep level traps. These traps are thought to play a leading role in the current collapse phenomena.

Ammonia plasma ionizes gas into charged particles that cause the surface to be cleaned and/or charged, as is well known. The chamber used herein for ammonia plasma treatment was a typical for semiconductor equipment manufacturers. Treatment duration was 3 minutes, although it can be higher or lower, but is typically in the range of 3-5 minutes. Other parameters that may be used to produce the desired ammonia plasma include power of 10-35 watts, ammonia flow rate of 30 to 70 sccm. Plasma frequency is 13.56 MHz.

Rf stress conditions included conditions for dc bias and a microwave signal that goes into the device. The input power of this signal is typically 10-15 dBM at a frequency of 2-12 GHz. The dc stress conditions include drain voltage typically of 20-30 volts and a drain current typically of 100-300 mA/mm.

In conclusion, reliability of AlGaN—GaN high electron mobility transistors that exhibit induced trapping effects due to extended dc bias or microwave operation has been improved by the incorporation of an ammonia plasma treatment prior to passivation. This processing step suppresses increases in current collapse and eliminates gate lag reductions after extended dc bias and significantly lessens degradation under microwave operation. It is believed that the interaction of the plasma with the exposed surface and H ions and/or atoms diffusion into the epitaxial layers are responsible for the improved device characteristics after extended dc bias and microwave operation.

While presently embodiments of the invention have been shown of the novel transistors and treatment with ammonia plasma, and of the several modifications discussed, persons skilled in this art will readily appreciate that various additional changes and modifications can be made without departing from the spirit of the invention as defined and differentiated by the following

What is claimed:

1. A method for treating a heterojunction transistor containing an AlGaN barrier and a GaN buffer, comprising:
performing an in-situ process comprising an ammonia plasma treatment carried out with an inductively coupled ammonia plasma followed by passivation of the heterojunction transistor.

2. The method of claim 1 wherein the ammonia plasma treatment is performed at a power level of 10-35 W.

3. The method of claim 2 wherein the ammonia plasma treatment has a duration in the range of about 3-5 minutes.

4. The method of claim 3 the ammonia plasma treatment further comprises applying a flow rate of ammonia gas at about 30 to 70 sccm.

5. The method of claim 4 wherein the passivation is carried out with silicon nitride.

6. The method of claim 5 wherein the transistor is characterized by the presence of a 2 DEG channel.

7. The method of claim 1 wherein DC power is turned off.

8. The method of claim 1, wherein the temperature is maintained during the in-situ process.

9. The method of claim 1, wherein the in-situ process is performed in a plasma enhanced chemical vapor deposition system.

10. The method of claim 1, wherein the transistor exhibits essentially no gate lag due to trapping effects after the in-situ process.

11. The method of claim 1, wherein the transistor exhibits essentially no drain current collapse due to trapped charge after the in-situ process.

12. The method of claim 1, wherein a rate of degradation of microwave power output, while under continuous microwave operation, is at least 100 times smaller compared to a silicon nitride passivated transistor that is not treated with the ammonia plasma.

* * * * *